United States Patent [19]
Lee et al.

[11] Patent Number: 5,801,415
[45] Date of Patent: Sep. 1, 1998

[54] NON-VOLATILE-MEMORY CELL FOR ELECTRICALLY PROGRAMMABLE READ ONLY MEMORY HAVING A TRENCH-LIKE COUPLING CAPACITORS

[75] Inventors: Jin-Yuan Lee; Mong-Song Liang, both of Hsin-Chu, Taiwan

[73] Assignee: Taiwan Semiconductor Manufacturing Company Ltd., Hsin-Chu, Taiwan

[21] Appl. No.: 947,832

[22] Filed: Oct. 8, 1997

Related U.S. Application Data

[62] Division of Ser. No. 649,977, May 16, 1996, Pat. No. 5,707,897.

[51] Int. Cl.$^6$ .......................... H01L 29/788; H01L 29/76
[52] U.S. Cl. ........................ 257/316; 257/314; 257/324
[58] Field of Search ........................ 257/314–324, 257/408, 296; 438/257, 258, 424, 227, 594; 365/185.29

[56] References Cited

U.S. PATENT DOCUMENTS

| | | | |
|---|---|---|---|
| 4,979,004 | 12/1990 | Esquivel et al. | 357/23.5 |
| 5,045,490 | 9/1991 | Esquivel et al. | 437/43 |
| 5,282,160 | 1/1994 | Yamagata | 257/324 |
| 5,343,063 | 8/1994 | Yuan et al. | 257/317 |
| 5,380,672 | 1/1995 | Yuan et al. | 437/43 |
| 5,441,908 | 8/1995 | Lee et al. | 437/52 |
| 5,610,419 | 3/1997 | Tanaka | 257/314 |
| 5,625,217 | 4/1997 | Chau et al. | 257/408 |
| 5,643,813 | 7/1997 | Acocella et al. | 438/594 |
| 5,680,345 | 10/1997 | Hsu et al. | 257/315 |
| 5,729,496 | 3/1998 | Jung | 257/321 |

*Primary Examiner*—Tom Thomas
*Assistant Examiner*—Cuong Quang Nguyen
*Attorney, Agent, or Firm*—George O. Saile; Stephen B. Ackerman

[57] ABSTRACT

A method for making an improved Electrically Programmable Read-Only-Memory (EPROM) device having non-volatile memory cells with enhanced capacitive coupling was achieved. The array of memory cells consists of a single field effect transistor (FET) having an additional floating gate. The FET is formed in a well etched into an insulating layer on the substrate surface. After forming the FET gate oxide, a polysilicon layer is patterned to form a trench-like floating gate with increased capacitive coupling. An inter-level dielectric layer is deposited. A second poly-silicon layer is deposited in the well and chem/mech polished back to form the control gate. The insulating layer having the wells is selectively removed. Lightly doped source/drain areas, self-aligned to the FET gate electrodes, are implanted and after forming sidewall spacers on the gate electrodes, source/drain contacts and buried bit lines are formed by a second implant. An insulating layer is deposited over the array of FETs having contact openings to the FET control gates. Another polysilicon layer is deposited and patterned to form the word lines. The word lines and buried bit lines are connected to the peripheral circuits to complete the EPROM chip.

3 Claims, 5 Drawing Sheets

NON-VOLATILE-MEMORY CELL FOR ELECTRICALLY PROGRAMMABLE READ ONLY MEMORY HAVING A TRENCH-LIKE COUPLING CAPACITORS

This is a division of patent application Ser. No. 08/649977, filing date May 16, 1996, now U.S. Pat. No. 5,707,897.

BACKGROUND OF THE INVENTION

(1) Field of the Invention

The present invention relates to programmable read-only memory (PROM) and more particularly to a method of fabricating an array of memory cell structures for electrically programmable read-only memory (EPROM) devices.

(2) Description of the Prior Art

A typical prior art EPROM-type device consists in part of an array of memory cells. Each cell is composed of a single field effect transistor (FET) having a floating gate and a control gate. The floating gate and control gate are typically formed by patterning two conductively doped polysilicon layers, and the floating gate, as its name implies, is completely surrounded by an electrically isolating dielectric. The floating gate is formed over a thin gate oxide grown on the channel area of the FET, and a thin interlevel dielectric insulating layer is formed on the floating gate. The control gate is formed on the dielectric insulating layer aligned over the floating gate, and is accessed by the peripheral circuits on the EPROM chip via word lines that interconnect the FET control gates. The control gate and floating gate are capacitively coupled through the thin dielectric layer. The selected cells are then coded (programmed) by applying a sufficiently high voltage potential between the control gate and the FET drain, resulting in the injection of hot channel electrons in the substrate through the thin gate oxide into the floating gate. Since the floating gate is well insulated, the accumulated charge is retained for an indefinite period of time thereby providing for an array of coded non-volatile memory (NVM) cells. The charge stored on the floating gate shifts the threshold voltage ($V_t$) on the programmed FET (charged FET), while the $V_t$ on the uncharged (non-programmed) FET is not shifted in value. For example, if the floating gate is formed on an N-channel FET, the $V_t$ on the programmed FET (negatively charged gate) is shifted to a higher positive voltage. When the memory cell on the EPROM chip is selected by the addressed decode circuit on the periphery of the EPROM chip, and a gate voltage ($V_g$) is applied to the control gate having a value between the $V_t$ of the non-programmed and programmed FETs, the non-programmed FET turns on and the programmed FET does not. The conductive state (on or off) of the FET channel is then interpreted as digital binary ones or zeros. Typically the stored data (electrical charge) on the EPROM chip is erased by removing the chip from the equipment, and exposing it for 20 to 30 minutes to ultraviolet radiation to generate electron-hole pairs in the gate oxide and to thereby provide an electrical path to discharge the floating gate. By incorporating these floating gates in a circuit with the proper circuit design, the floating gates can be discharged (erased) by reversing the polarity of the programming voltage, allowing for the fabrication of electrically erasable programmable read-only memory (EEPROMs). And further, by providing for the simultaneous erasure of all the coded memory cells, flash EEPROMs can also be fabricated.

The double gate in the FET patterned from the two doped polysilicon layers represents a capacitive divider. It is desirable to have the threshold voltage ($V_t$) as low as possible for higher density EPROM circuits. For example, for even an uncharged floating gate, the FET appears to have a higher threshold voltage ($V_t$) as viewed from the control gate than an equivalent FET would have without the floating gate. For example, a gate voltage of $V_2$ on the control gate results in a low voltage $V_1$ on the floating gate having a value of $V_1 = K \times V_2$, where $K = C_2/(C_1 + C_2)$ is the capacitive coupling constant, $C_2$ is the capacitance between the control gate and the floating gate, and $C_1$ is the capacitance between the floating gate and the conducting channel of the FET. To minimize the operating and programming voltages, it is desirable to have the capacitive coupling between the control gate and floating gate as large as possible, therefore $C_2$ should be as large as possible.

Unfortunately, during the further downscaling of the minimum feature sizes on the EPROM integrated circuit to achieve the millions of memory cells required for future EPROM chips having a reasonable size, it is necessary to reduce the area that the memory cell occupies on the chip. However, this necessarily reduces the area of the gate electrodes, and thereby reduces the capacitive coupling ratio K between the floating and control gates on a conventional prior art EPROM. Several methods can be employed to increase the capacitance. For example, the thin interlevel dielectric layer can be further reduced in thickness, the dielectric layer can be composed of a higher dielectric constant material, and/or the electrode areas can be increased without increasing the cell area occupied on the EPROM chip. Reducing the thickness of the thin dielectric layer beyond certain limits can result in pin holes, and unacceptable dielectric breakdown voltages. For example, a good thermal oxide ($SiO_2$) breaks down at an electric field of about $1 \times 10^7$ volts/cm. High dielectric constant materials withstanding high dielectric breakdown fields, such as $1 \times 10^7$ V/cm would be required to compete with the more conventional silicon oxide ($SiO_2$). Several methods have been described in the prior art for increasing the gate electrode areas while maintaining or reducing the memory cell area occupied on the chip. One method for providing an EPROM with enhanced capacitive coupling is described by A. Esquivel et al. in U.S. Pat. Nos. 4,979,004 and 5,045,490, in which a gate oxide is formed in the bottom of a trench etched in a P− doped silicon substrate over the FET channel, while a thicker oxide is formed on the source/drain contact areas formed in the sidewalls of the trench. The polysilicon floating gate, the interlevel dielectric composed of silicon oxide and silicon nitride, and the polysilicon control gate are formed by a series of process steps on the gate oxide and insulated sidewalls in the trench to effectively increase the area of the two electrodes and the capacitive coupling therebetween. Another approach is described by J. Yuan, U.S. Pat. No. 5,343,063 and U.S. Pat. No. 5,380,672, in which the source/drain areas are first diffused into a silicon substrate, and the floating gates are then formed in trenches aligned and etched in an insulating layer over the FET channel between the source/drain areas. The trench is offset from the channel to form a split-channel memory cell device. The floating gate is formed on the sidewalls of the trenches to increase the coupling capacitance.

However, as the device feature sizes are down-scaled to achieve increased numbers of memory cells on a reasonably sized chip, well in excess of a million cells per chip, it is desirable to form these single FET non-volatile memory cells having floating gates which retain or increase their capacitive coupling, while also providing for self-aligning lightly doped drains (LDD) and source/drain contacts for improved device performance.

SUMMARY OF THE INVENTION

It is the principal object of this invention to provide a memory cell structure and a method for forming these non-volatile memory cells on EPROM devices having enhanced capacitive coupling between the control gate and the floating gate.

It is another object of this invention to form these non-volatile memory cells using a single field effect transistor (FET) having self-aligned, lightly doped drains (LDD), and also having self-aligned source/drain contacts.

It is still another object of this invention to form these EPROM devices using cost-effective manufacturing processes.

In accordance with the objectives of this invention, a method is provided for fabricating an electrically programmable read only memory (EPROM) device having memory cells with enhanced capacitive coupling between the floating gate and the control gate. In summary, the method begins by providing a semiconductor substrate, such as a $P^-$ doped single crystal silicon having a <100> crystallographic orientation. Trenches are then etched in the silicon substrate by masking and anisotropic plasma etching in which are formed planar field oxide regions for electrically isolating device areas on the substrate. The exposed silicon surface in the trenches is thermally oxidized to provide a good silicon oxide to silicon interface having low interface charge. If desired, a $P^+$ dopant (boron) can be implanted in the bottom of the trenches forming a channel-stop layer to prevent surface inversion. A conformal first insulating layer is deposited in the trenches and elsewhere on the substrate, and then planarized by either plasma etching back or by chemical-mechanical polishing to the substrate surface. The field oxide regions separate device areas into arrays of intersecting rows and columns on the substrate. The column device areas will eventually be used to form buried bit lines in the array of memory cells. The row device areas between the bit line column areas are then used to fabricate the array of non-volatile memory (NVM) cells, where each cell is comprised of a single FET having a floating gate. Continuing with the process, a second insulating layer is deposited on the silicon substrate. Using conventional photolithographic techniques and anisotropic plasma etching, wells are etched in the second insulating layer down to the substrate. The wells also are formed over the row device areas, and also extend over the field oxide regions on each side of the row device areas, and also are formed between two adjacent column device areas. The silicon substrate surface exposed in the wells is thermally oxidized to form the FET gate oxide. The floating gate electrode is now formed from a first polysilicon layer which is conformally deposited on the second insulating layer and in the wells. The first polysilicon layer is deposited using low pressure chemical vapor deposition (LPCVD) and conductively doped in situ by adding phosphine ($PH_3$) during the polysilicon deposition. The first polysilicon layer is then patterned leaving portions in the wells that extend over opposite sidewalls of the wells that are parallel to the column device areas, while removing portions of the polysilicon layer from the other sidewalls parallel to the row device areas. The patterning also removes the first polysilicon layer over the planar field oxide regions within the wells. Next, a thin dielectric insulating layer is formed on the patterned first polysilicon layer, this layer serves as the interlevel dielectric insulating layer between floating gates formed from the first polysilicon layer and a second polysilicon layer deposited later to form the control gate electrodes. The insulating layer is preferably composed of a thin silicon oxide-silicon nitride layer which is then thermally oxidized to form a $SiO_2/Si_3N_4/SiO_2$ layer (ONO) having a high dielectric constant and is pin-hole free. The control gate electrodes are now formed by depositing a conformal second polysilicon layer by LPCVD, and which also fills the wells. The second polysilicon layer is conductively doped with $N^+$ impurities similar to the first polysilicon layer. Alternatively, the second polysilicon layer can be doped by ion implantation, such as phosphorus ($P^-$). The second polysilicon layer, the dielectric insulating layer, and portions of the first polysilicon layer are now chemical/mechanically polished back to the surface of the second insulating layer. The second insulating layer is removed selectively by etching to the surface of the silicon substrate, thereby exposing the device areas, while leaving the array of completed FET gate electrodes having floating gates. Since the floating gates also extend vertically upward on the sidewalls of the FET control gates, the coupling capacitance is substantially increased. The device areas adjacent to the FET gate electrodes are now doped by ion implantation, using for example, arsenic ($As^{75}$) or phosphorus ($P^-$) ions, to form the lightly doped source/drain areas, which are self-aligned to the gate electrodes. A conformal third insulating layer is deposited on the substrate and etched back to form sidewall spacers on the sidewalls of the gate electrodes. A second ion implant is used to form the source/drain contact areas for FETs while also forming the buried bit lines in the column device areas. A fourth insulating layer is deposited over the gate electrodes and elsewhere on the substrate to insulate the devices from the next level of interconnections. Contact openings are etched in the fourth insulating layer to the control gate electrodes that extend over the field oxide regions. The EPROM is now completed by depositing and patterning a third polysilicon layer to form the word lines that contact the gate electrodes through the contact openings. Preferably the third polysilicon layer is conductively doped $N^+$, using for example, phosphorus (P), and alternatively a silicide layer can be formed on the third polysilicon layer to further enhance conductivity and improve device performance.

BRIEF DESCRIPTION OF THE DRAWINGS

The object and other advantages of this invention are best explained and will become more apparent in the preferred embodiment with reference to the accompanying drawings, in which:

FIGS. 2A through 7A depict schematic cross sectional views along the line 3A–3A' shown in FIG. 1 of the sequence of processing steps for making the memory cells described in this invention.

FIGS. 2B through 7B depict schematic cross sectional views along the line 3B–3B' shown in FIG. 1 of the sequence of processing steps for making the memory cells described in this invention.

DESCRIPTION OF THE PREFERRED EMBODIMENTS

This invention is now described in detail for making an array of non-volatile memory cells, and more specifically for EPROM circuits. The method involves forming non-volatile memory cells on rows of device areas that lie between columns of device areas that intersect the row device areas, and are essentially orthogonal to each other. The column device areas provide buried bit lines for the NVM formed from the FETs. The NVM cells are formed from a single FET that incorporates a floating gate over the FET channel area. The floating gate also extends vertically upward on the sidewalls of the control gate, thereby increasing the capacitor area between the floating and control gates. A thin, high-dielectric-constant insulating layer composed of a silicon oxide/silicon nitride/silicon oxide (ONO) layer is formed on the floating gate prior to forming the control gate and provides a reliable, pin-hole free, interlevel dielectric layer.

Although the invention is described for making non-volatile memory cells using N-channel FETs on a P-doped silicon substrate, it should be well understood by those skilled in the art that the NVM cells can also be formed from P-channel FETs. Furthermore, by incorporating additional processing steps, these non-volatile memory cells can be formed on chips with P and N wells, thereby providing for complementary metal oxide/silicon (CMOS) circuits using conventional FETs having a single gate electrode, such as those required on the periphery of a memory chip for accessing and reading and writing information to and from the array of memory cells.

Figure 1:
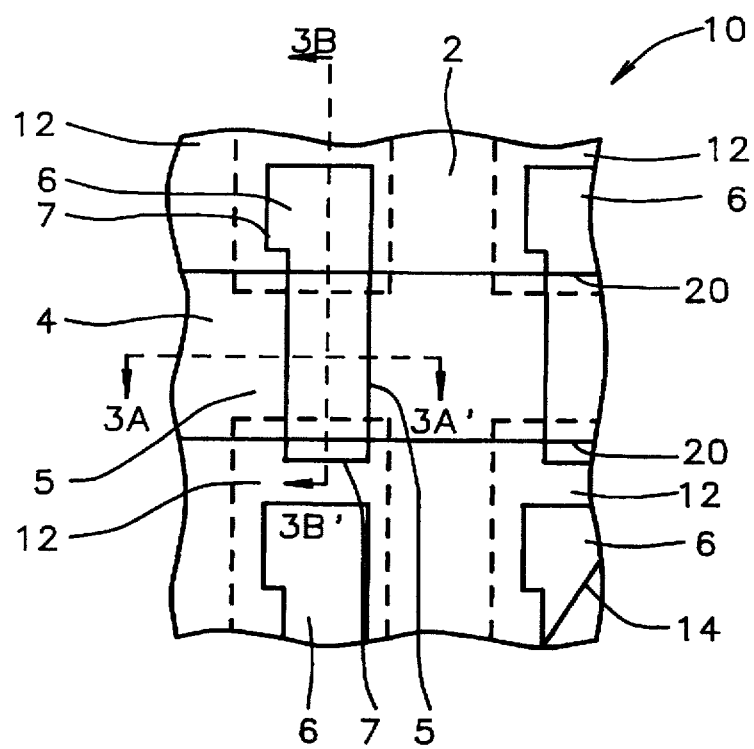
FIG. 1 is a schematic elevational view of a portion of an array of non-volatile memory cells for an EPROM device. The lines 3A–3A' and 3B–3B' through one of the cells is shown in cross sectional view in FIGS. 3A and 3B.

Referring initially to FIG. 1, a schematic elevational view is shown of an EPROM cell area. For practical reasons, only a single memory cell of the array of memory cells is depicted. The line through region 3A–3A' indicates the cross-sectional area shown in FIGS. 2A–7A, and the line through region 3B–3B' indicates the cross-sections shown in FIGS. 2B–7B. To better understand the invention, a brief overview of the non-volatile cell structure is provided, and then the detailed process descriptions are given with reference to FIGS. 2A–7A, and FIGS. 2B–7B.

FIG. 1 shows a portion of an array of non-volatile memory cell areas on a substrate 10 having an array of column device areas, one of the many columns labeled 2 is shown in the FIG. Also shown is one row device area labeled 4 for an array of device areas on the substrate. The row and column device areas are defined and electrically isolated from each other by forming planar field oxide regions 12. Also shown in FIG. 1 are wells labeled 6 that are etched in an insulating layer 14 deposited over the substrate after forming the row and column device areas. Each well is eventually used to form a single FET in each memory cell area over a row device area having an additional floating gate to provide for a non-volatile memory (NVM) cell. Also shown in FIG. 1 is a patterned portion of a first polysilicon layer 20 extending over the well areas 6 on a gate oxide (now shown) grown on the exposed device area. The patterned first polysilicon layer 20 completely covers the gate oxide in the wells and extends over the insulating layer 14, as shown in FIG. 1. The patterned first polysilicon layer 20 on the gate oxide and extending upward on the well sidewalls of the wells 6 will eventually form the floating gate for the FETs having increased surface area and thereby increased capacitive coupling. FIGS. 2A–7A and FIGS. 2B–7B show the cross-sectional view for one of the many cells formed concurrently by the method of this invention.

Referring now to FIGS. 2A–7A, the details of the new and improved memory cell structure and process for manufacturing an array of NVM cells are described. The process starts by providing a semiconductor substrate 10. The preferred substrate is typically composed of a P⁻ doped single crystal silicon having a <100> crystallographic orientation, doped for example with boron. The substrate or P-well for fabricating the N-channel FET is typically doped having a concentration between about 1 E 14 to 1 E 15 atoms/cm³. Referring now to FIG. 2B, a planar field oxide 12 is formed in the substrate. The method for making the field oxide 12 involves using a photoresist mask and anisotropic etching to form trenches in the silicon substrate to a depth of between about 3000 and 10000 Angstroms, the trenches having essentially vertical walls. The trenches can be etched, for example, using a chlorine based gas mixture and reactive ion etching (RIE). After stripping the photoresist, a thermal oxide is grown in the trenches on the silicon substrate to provide a good quality interface. Typically the thermal oxide is between about 100 and 500 Angstroms thick. In addition, it is desirable to provide a P⁺ implant in the bottom of the trenches to form a channel-stop layer to prevent surface inversion.

Figure 2A:
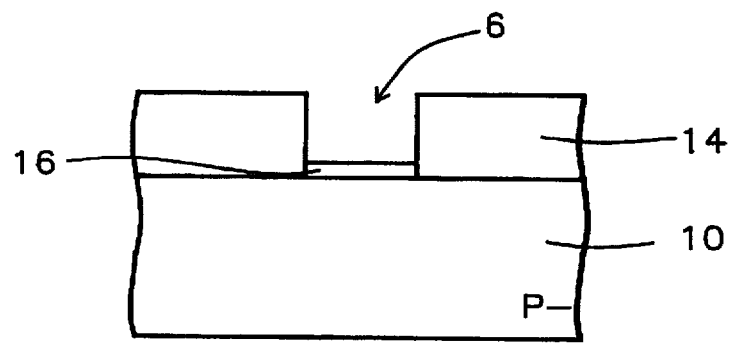
Figure 2B:
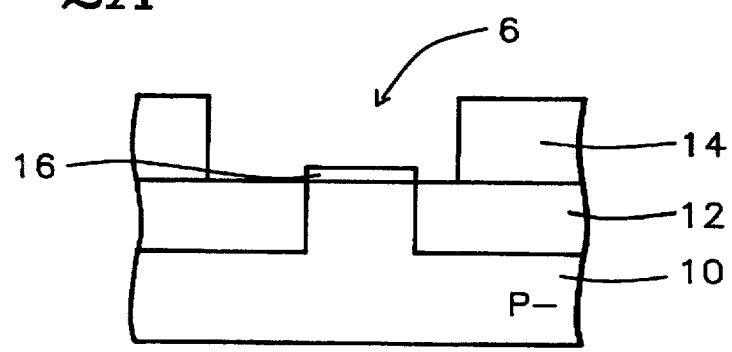

Still referring to FIG. 2B, a conformal first insulating layer 12 is deposited on the substrate sufficiently thick to fill the trenches. Preferably the first insulating layer 12 is composed of a silicon oxide deposited by low pressure chemical vapor deposition (LPCVD) using, for example, tetraethosiloxane (TEOS) as the reactant gas. Layer 12 is then planarized by plasma etching back the silicon oxide to the substrate surface using, if necessary, a planarizing layer such as photoresist or a polymer and a plasma etch having a 1-to-1 etch rate selectivity. Alternatively, layer 12 can be polished back to the substrate surface using chemical/mechanical polishing (CMP). The remaining insulating layer 12 in the trenches forms the field oxide regions 12 between the intersecting row and column device areas 4 and 2, respectively, as shown in FIG. 1, and in cross sectional view in FIG. 2B.

Referring still to FIG. 2A and 2B, a second insulating layer 14 is deposited on the silicon substrate. Preferably layer 14 is deposited by LPCVD using a reactant gas such as TEOS. The preferred thickness of layer 14 is between about 2500 and 5000 Angstroms. Conventional photolithographic techniques and anisotropic plasma etching are used to etch wells 6 having essentially vertical walls in the insulating layer 14 to the surface of the substrate 10. As shown in FIG. 1, the wells 6 are formed over the row device areas 4 and also extending over the field oxide region 12. The FETs having floating gates providing for the NVM cells are now formed in the wells 6.

As shown in FIGS. 2A and 2B, the FET gate oxide 16 is formed by thermal oxidation of the exposed silicon surface within the well areas 6. Preferably the gate oxide is grown to a thickness of between about 40 and 200 Angstroms, for example, by thermal oxidation in a dry oxygen ambient.

Figure 3A:
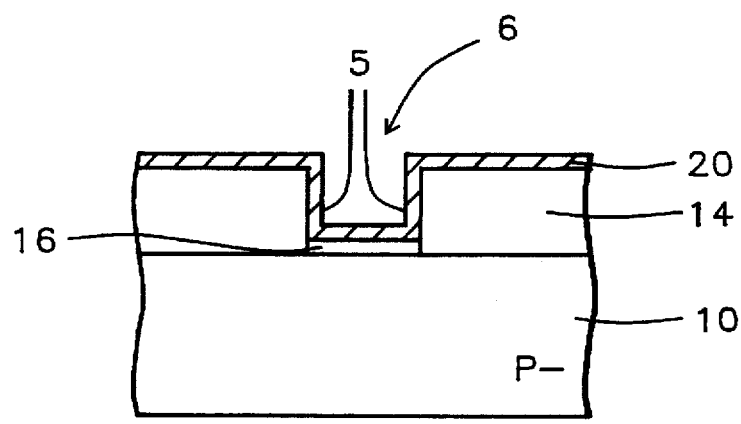
Figure 3B:
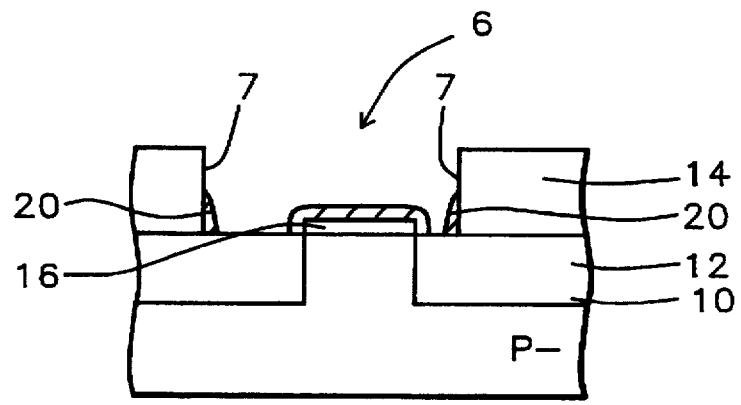

Referring next to FIG. 3A and 3B, the floating gate electrodes are formed from a first polysilicon layer 20, which is conformally deposited on the second insulating layer 14 and in the wells 6. Layer 20 is preferably deposited by LPCVD using, for example, a reactant gas such as silane (SiH₄). The polysilicon is preferably in-situ doped during deposition by adding to the silane a dopant gas such as phosphine (PH³). The desired thickness of layer 20 is between about 300 and 1000 Angstroms. The dopant concentration of layer 20 is preferably between about 1.0 E 20 and 1.0 E 21 atoms/cm³. The polysilicon layer 20 is patterned by conventional photolithographic techniques and anisotropic plasma etching to leave portions over the gate oxide 16 and on the sidewalls 5 in the well areas 6, as shown in FIG. 3A, while removing most of the polysilicon layer 20 over the field oxide regions 12 and over the sidewalls 7, as shown in FIG. 3B. This eventually provides a floating gate electrode having vertical extending portions on the sidewalls 5 that increase the capacitive coupling, as shown in FIG. 3A.

Figure 4A:
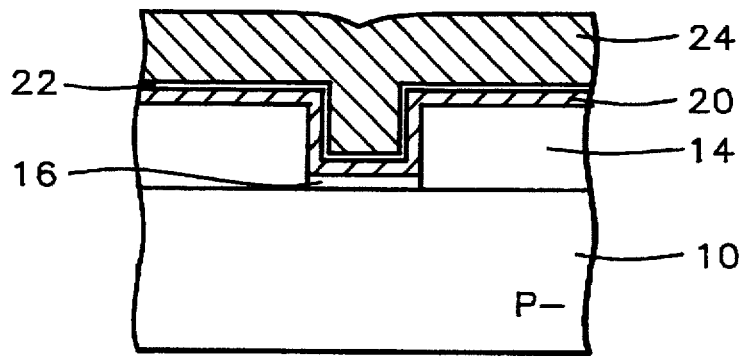
Figure 4B:
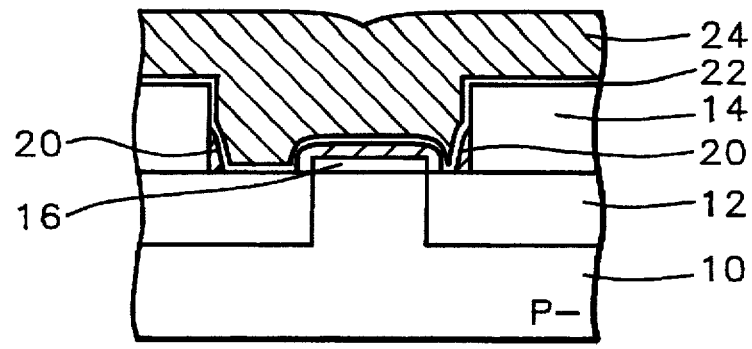

Next, a thin dielectric insulating layer 22 is formed on the patterned first polysilicon layer 20, as shown in FIGS. 4A and 4B. Preferably, insulating layer 22 is composed of a silicon oxide/silicon nitride/silicon oxide (ONO) having a thickness of between about 50 and 100 Angstroms. Layer 22 can be formed by thermally oxidizing the polysilicon layer 20 and depositing a silicon nitride layer using, for example, LPCVD by reacting dichlorosilane ($SiCl_2H_2$) and ammonia ($NH_3$) at a temperature between 700° and 800° C. The silicon nitride layer is then subjected to a thermal oxidation to oxidize the surface of the silicon nitride layer, to complete the ONO. Layer 22 serves as the interlevel dielectric insulating layer between floating gates formed from the first polysilicon 20 layer and a second polysilicon layer that is deposited later to form the control gate electrode for the FET.

Referring still to FIG. 4A, a conformal second polysilicon layer 24 is deposited over the dielectric insulating layer 22 thereby filling the wells 6. Layer 24 is used to form the control gates for the FETs. Polysilicon layer 24 can be deposited by LPCVD using, for example, silane, and is also conductively doped with an $N^+$ dopant such as phosphorus or arsenic by ion implantation or in-situ doped during the polysilicon deposition. Layer 24 is deposited to a thickness sufficient to fill the trenches, which is preferably to a thickness greater than about 3000 Angstroms.

Figure 5A:
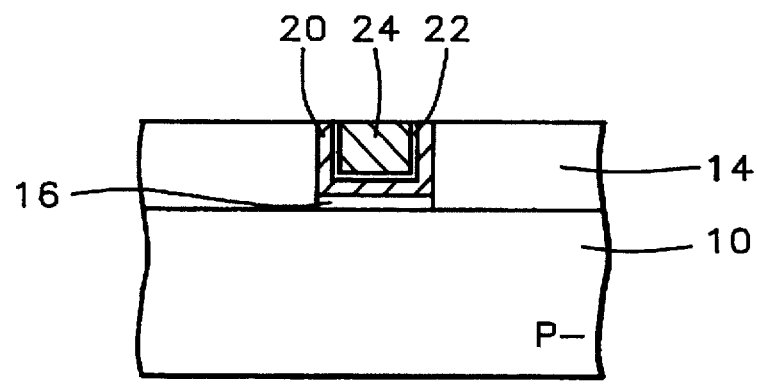
Figure 5B:
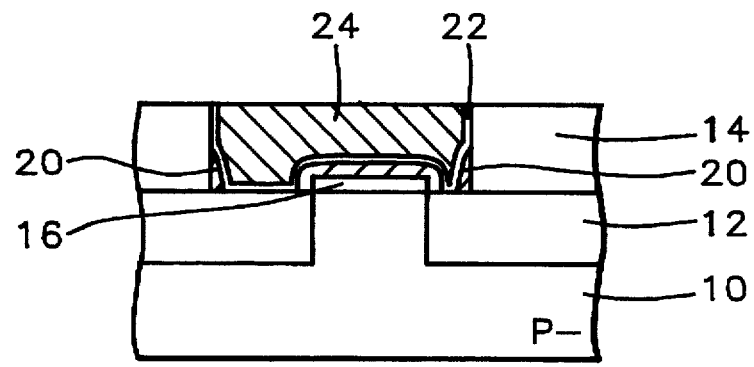

Now referring to FIGS. 5A and 5B, the second polysilicon layer 24, the dielectric insulating layer 22, and portions of the first polysilicon layer 20 are chemical/mechanically polished back to the surface of the second insulating layer 14. The polishing back to layer 14 forms an array of electrically isolated FET gate electrodes having floating gate electrodes, such as the floating gate 20 that extends vertically upward along the sidewalls of the control gate 24. The increase surface area of the floating gate on the sidewall significantly increases the capacitive coupling between the floating gate 20 and control gate 24. via the thin interlevel dielectric insulating layer 22, there-between. The high dielectric constant of the silicon nitride in layer 22 further increases the capacitive coupling.

Figure 6A:
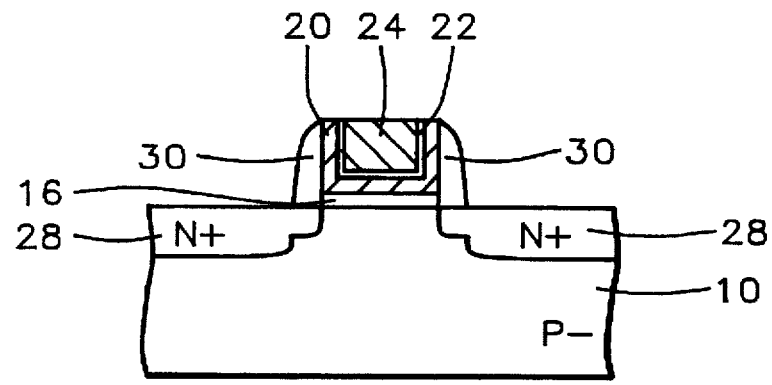
Figure 6B:
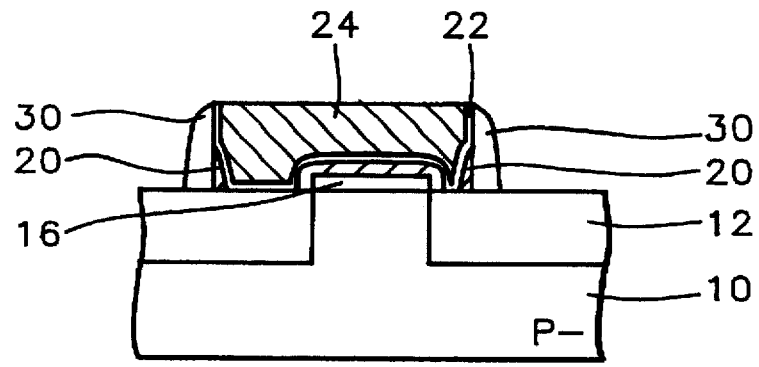

Referring now to FIGS. 6A and 6B, the second insulating layer 14 in which the wells 6 are formed is now selectively removed to the surface of the silicon substrate 10, thereby exposing the device areas adjacent to the FET gate electrodes composed of layers 16, 20, 22, and 24, and also exposing the substrate surface in the column device areas. Second insulating layer 14 is removed by selectively etching in a solution of hydrofluoric acid ($HF/H_2O$).

Still referring to FIGS. 6A and 6B, lightly doped source/drain (LDD) areas are formed adjacent to the FET gate electrode. Preferably the LLD areas are formed by ion implantation using, for example, arsenic ($As^{75}$) or phosphorus ($P^-$) ions. The ion implant dose is preferably between about 1.0 E 13 and 5.0 E 13 ions/$cm^2$, and the ion implant energy is between about 20 and 70 keV. The LDD implant is also formed in the exposed column device areas (labeled 2 in FIG. 1) which will later serve as the bit lines for the array of NVM cells. The masking effect of the FET gate electrodes to the ion implantation results in the lightly doped source/drain areas being self-aligned to the gate electrodes.

Next as shown in FIG. 6 A and 6B, a conformal third insulating layer 30 is deposited on the substrate and etched back to form sidewall spacers 30 on the sidewalls of the FET gate electrodes. The insulating layer 30 is preferably composed of silicon oxide ($SiO_2$) and is deposited in a LPCVD reactor using a reactant gas, such as TEOS. The preferred thickness of layer 30 is between about 1000 and 3000 Angstroms, and etched back to form sidewall spacers 30 having a width about equal to the thickness of layer 30. The heavily doped source/drain contact areas 28 are formed next by using ion implantation and also using arsenic ($As^{75}$) or phosphorus ($P^-$) ions as the implant source. The ion implant dose is preferably between about 1.0 E 15 and 7.0 E 15 ions/$cm^2$ and is implanted at an ion energy of between about 10 and 70 keV. This implant is carried in the exposed column device areas 2 in FIG. 1 to form the buried bit lines for the array of FETs in the NVM cells.

Figure 7A:
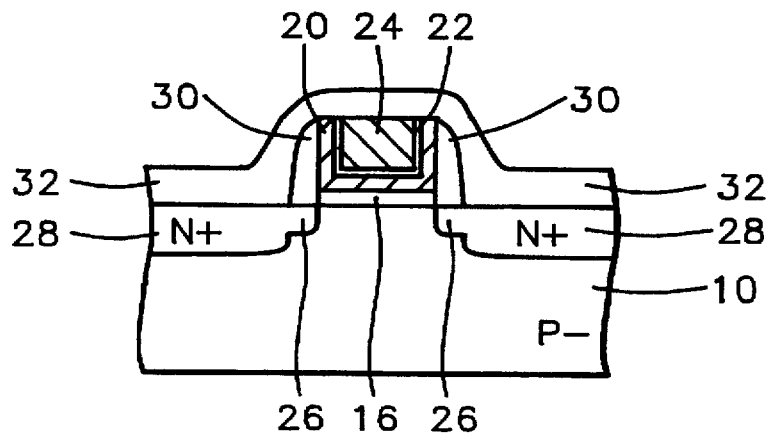
Figure 7B:
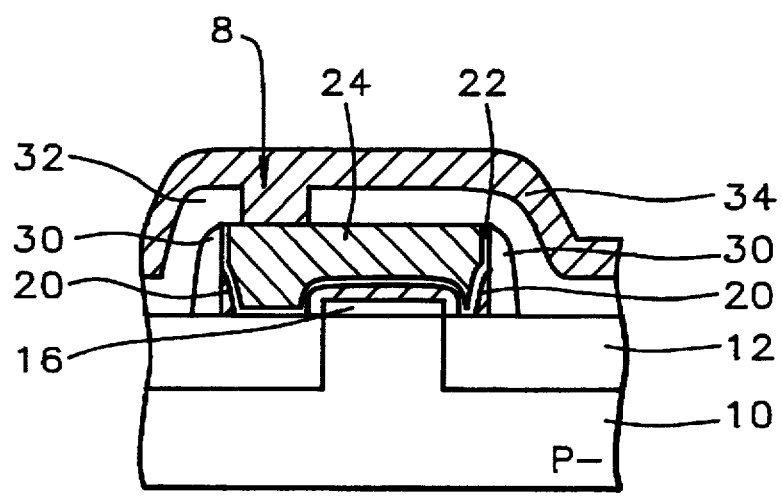

Referring now to FIGS. 7A and 7B, a conformal fourth insulating layer 32 is deposited over the gate electrodes and elsewhere on the substrate to insulate the FET devices and the bit lines from the next level of interconnecting metallurgy. The preferred insulating layer 32 is also a plasma enhanced CVD-deposited silicon oxide ($SiO_2$) or atmospheric pressure CVD-deposited SiO2, using, for example TEOS. Alternatively a borophosphosilicate glass (BPSG) can be used, for example, using a boron and phosphorus doped TEOS (BPTEOS). The preferred thickness of layer 32 is between about 500 and 3000 Angstroms for undoped $SiO_2$, and between about 2000 and 10000 Angstroms for BPSG. Contact openings 8 are then etched in layer 32 to the control gate electrode 24 over the planar field oxide regions 12, as shown in FIG. 7B. The contact openings 8 are preferably etched using conventional photolithographic techniques and anisotropic plasma etching. For example, this can be carried out in a reactive ion etching chamber using an etchant gas such as trifluoromethane ($CHF_3$) or alternatively carbon tetrafluoride ($CF_4$) and helium (He).

Still referring to FIG. 7B, the EPROM is now completed by depositing and patterning a third polysilicon layer 34 to form the word lines 34 that contact the gate electrodes through the contact openings 8. The polysilicon layer 34 is preferably deposited using LPCVD and a reactant gas such as silane ($SiH_4$), and is deposited to a thickness of between about 2000 and 5000 Angstroms. Preferably the third polysilicon layer is conductively doped $N^+$, using for example, phosphorus (P), either by ion implantation or by in-situ doping with phosphine ($PH_3$) during the LPCVD of the polysilicon layer 34. In addition, a silicide layer can be formed on the third polysilicon layer 34 prior to patterning to further enhance conductivity and improve device performance. Layer 34 is then patterned using an anisotropic plasma etching that has a high etch rate selectivity to silicon oxide, such as using an etchant gas mixture containing chlorine. Since the polysilicon layer 34 is patterned so as not to cover the gate electrodes, layer 34 is not shown in FIG. 7A.

While the invention has been particularly shown and described with reference to the preferred embodiments thereof, it will be understood by those skilled in the art that various changes in form and details may be made without departing from the spirit and scope of the invention.

What is claimed is:

1. An array of non-volatile memory cells having enhanced capacitive coupling, comprising:

trenches in a silicon substrate having planar field oxide regions therein formed by depositing a first insulating layer and etching back said first insulating layer to said silicon substrate surface;

said planar field oxide regions electrically isolating an array of column device areas and an array of row device areas in and on said substrate surfaces said array of row device areas orthogonal to and intersecting said array of column device areas;

an array of FET gate electrodes extending across said row device areas and over said adjacent planar field oxide regions and further lying between adjacent column device areas; and further, said array of FET gate electrodes consist of:

gate oxide regions formed by thermal oxidation on said silicon substrate;

floating gates formed from a first polysilicon layer on said gate oxide regions and having at least two inner and outer vertical sidewalls;

interlevel dielectric insulating layer formed on said floating gates over said gate oxide regions and on inner sidewalls of said floating gates;

control gates formed from a second polysilicon layer filling completely the volume between said inner sidewalls of said floating gates;

lightly doped source/drain areas self-aligned and adjacent to outer sidewalls of said floating gates;

sidewall spacers formed from an insulating layer on said outer sidewalls of said floating gates;

source/drain contact areas adjacent and self-aligned to said sidewall spacers formed by ion implantation and said ion implantation concurrently forming buried bit lines for said array of said FETs, thereby providing an array of non-volatile memory cells.

2. The structure of claim 1, wherein said interlevel dielectric insulating layer is composed of silicon oxide/silicon nitride/silicon oxide (ONO) multilayer.

3. The structure of claim 1, wherein said array of NVM cells is coded by selectively injecting and storing electronic charge on floating gates, and thereby changing the threshold voltage of said FETs to program in binary digital data.

* * * * *